US006975130B2

(12) United States Patent
Yevmenenko (10) Patent No.: US 6,975,130 B2
(45) Date of Patent: Dec. 13, 2005

(54) TECHNIQUES FOR CONTROLLING MOVEMENT OF A CIRCUIT BOARD MODULE ALONG A CARD CAGE SLOT

(75) Inventor: Yan Yevmenenko, Philadelphia, PA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 10/748,318

(22) Filed: Dec. 30, 2003

(65) Prior Publication Data
US 2005/0146347 A1 Jul. 7, 2005

(51) Int. Cl.[7] .............................................. G01R 31/02
(52) U.S. Cl. .................... 324/765; 324/755; 324/158.1
(58) Field of Search ............................... 324/73.1, 755, 324/765, 158.1; 361/728, 733, 802, 809

(56) References Cited

U.S. PATENT DOCUMENTS

| 4,488,299 | A |   | 12/1984 | Fellhauer et al. |         |
|-----------|---|---|---------|------------------|---------|
| 6,100,706 | A | * | 8/2000  | Hamilton et al.  | 324/760 |
| 6,310,783 | B1| * | 10/2001 | Winch et al.     | 361/797 |
| 6,577,507 | B2| * | 6/2003  | Yamaguchi et al. | 361/754 |

| 2002/0125997 | A1 | 9/2002 | Kashi et al. |

FOREIGN PATENT DOCUMENTS

| FR | 2 704 958       | 11/1994 |
| JP | 03250696        | 11/1991 |
| JP | 04062897        | 2/1992  |
| WO | WO-2004/097724 A1 | 11/2004 |

OTHER PUBLICATIONS

International Search Report, Mailing Date May 9, 2005.

* cited by examiner

*Primary Examiner*—Minh N. Tang (57) ABSTRACT

A control system indicates whether a module should be inserted into a module holder. The control system includes a sensor which is configured to attach to one of a module and the module holder. The sensor is further configured to (i) read an identifier of an element attached to the other of the module and the module holder when the module begins insertion into the module holder and (ii) provide a sensor signal in response to reading the identifier. The sensor signal denotes the identifier. The control system further includes a controller which couples to the sensor. The controller is configured to receive the sensor signal from the sensor and output a control signal based on the sensor signal. The control signal indicates whether the module is authorized to substantially insert into the module holder.

12 Claims, 5 Drawing Sheets

TECHNIQUES FOR CONTROLLING MOVEMENT OF A CIRCUIT BOARD MODULE ALONG A CARD CAGE SLOT

BACKGROUND

Automated test equipment (ATE) enables electronic testing, in volume, of units-under-test (UUTs) in a reliable and consistent manner. Examples of UUTs include semiconductor devices (e.g., processors, application specific integrated circuits, field programmable gate arrays, etc.), circuit boards (e.g., motherboards, daughter cards, multi-chip modules, etc.), and the like.

The equipment, which is commonly referred to as an automatic test system or simply tester, typically includes an instrumentation and support assembly (hereinafter simply referred to as the instrumentation assembly) and a computer. The instrumentation assembly typically includes circuit board modules which vary in design and function. For example, some modules specialize in driving certain types of signals onto the UUTs (e.g., digital signals, analog signals, radio frequency signals, combinations thereof, etc.). Other modules specialize in detecting such signals from the UUTs. Yet other modules provide power supply signals, overhead, timing, etc. Typically, the instrumentation assembly further includes a card cage for holding the modules and a backplane for connecting the modules to the computer. Once an appropriate combination of these modules is properly installed within the card cage of the instrumentation assembly, the computer communicates with these modules through the backplane to coordinate their operation and thus perform comprehensive testing of the UUTs. The computer also plays an effective role in analyzing and evaluating the results of such testing.

In general, manufacturers attempt to provide automatic test systems which are easily re-configurable for enhanced flexibility. To this end, some tester manufacturers (i) provide the card cage of the instrumentation assembly with universally-sized card cage slots and (ii) size the circuit board modules to fit into any of the universally-sized card cage slots regardless of function. As a result, customers of such automatic test systems are then capable of installing different combinations of the circuit board modules into the card cage slots and thus are capable of performing a variety of different tests using the different combinations of modules, e.g., different tests on the same UUTs, different tests on different UUTs, etc.

Although the card cage slots of the above-described card cage are universal in size (i.e., each card cage slot permits insertion of any circuit board module regardless of function), the configurations of backplane connectors within the card cage (i.e., the corresponding connectors on the backplane which mate with connectors on the circuit board modules) may not be uniformly positioned from card cage slot to card cage slot. Accordingly, some circuit board modules will not properly connect in certain card cage slots. Moreover, for any given slot, even if the backplane connectors properly match the circuit board connectors of a particular circuit board module, there are occasions when that module may still be unable to properly install into that slot due to a component height restriction (e.g., a component of the module may be too tall thus providing an obstruction that prevents that module from properly inserting all the way into that slot).

To prevent insertion of a circuit board module into an incorrect card cage slot and thus to avoid damage to either the module (e.g., connectors or tall components of the module) and/or the backplane connectors housed within the card cage, tester manufacturers typically provide keying mechanisms at the back end of the card cage in the area of the backplane. That is, each card cage slot has a unique physical keying feature that enables only certain modules to fully insert into that slot. In one approach, the tester manufacturer provides the backplane connectors with alignment pins and the circuit board connectors with alignment holes (or vice versa), thus only allowing a module to fully install into the card cage when the alignment pins properly align with the alignment holes. If the alignment pins do not match with the alignment holes, the alignment pins provide mechanical interference against the module and the module is incapable of fully inserting into the card cage. In another approach, the tester manufacturer provides an alignment notch or indentation at a particular location along the connecting edge of the module and an alignment tab along a location of the backplane thus only allowing a module to fully install into the card cage when the alignment notch location matches the alignment tab location. If the alignment notch location does not match the alignment tab location, the tab provides interference against the module thus preventing the module from inserting further into the card cage. As a result of these keying approaches, only properly keyed modules (e.g., modules with properly located alignment holes or alignment notches) are permitted to fully insert into the card cage.

SUMMARY

Unfortunately, there are deficiencies to the above-described conventional keying approaches to preventing insertion of a circuit board module into an incorrect card cage slot in order to avoid damage to either the module (e.g., connectors or tall components of the module) and/or the backplane connectors housed within the card cage. For example, the alignment pins or the alignment tabs are not always long enough to prevent damage to the connectors. Rather, parts of the module and the backplane may come into contact before the alignment pins or the alignment tabs are able to provide adequate interference to prevent further insertion. For instance, in the context of a card cage assembly having rather delicate card ejector latches at the back end of the card cage, the alignment pins or tabs may not be long enough to prevent an improperly keyed module from applying pressure to and partially engaging with the card ejector latches and thus causing damage.

Additionally, the module connectors and the backplane connectors tend to occupy the majority of the area along the connecting edge of the module thus leaving little space left for placement of alignment holes or alignment notches. Accordingly, there may only be a few keying permutations (i.e., only a few available locations for alignment structures) even though there may be many types of modules thus requiring more keys than that which are available. As a result, the above-described conventional keying approaches may provide an inadequate number of keys for practical use.

Furthermore, even if there alignment structures are long enough and even if there are an adequate number of keys, the above-described conventional keying approaches do not adequately address the possibility of insertion of a circuit board module into a card cage slot where one or more components is too tall for that particular card cage slot. Rather, such a clearance inadequacy is typically detected when contact is made between a component and a neighboring obstruction. Unfortunately, by that time, the component may have sustained damage.

Moreover, it is difficult and a design burden to develop and implement an effective physical keying subsystem within ATE. In some instances, such keying subsystems are implemented as afterthoughts after main development of the ATE is complete.

In contrast to the above-described conventional keying approaches, embodiments of the invention are directed to techniques for determining insertability of a circuit board module into module holder (e.g., a card cage) which involve sensing an identifier and electronically authorizing further insertion of the module based on the identifier. Accordingly, control over further insertion of the module does not need to take place at the back end of the module holder. Rather, such control may take place at the front of the module holder in response to sensing of the identifier thus robustly and reliably preventing damage to the module if the module is not authorized to substantially insert into the module holder (e.g., along the particular card cage slot). Such techniques are well-suited for use in an automatic test system (e.g., a semiconductor tester, a circuit board tester, etc.) having (i) a card cage that provides universally-sized card cage slots and (ii) a variety of circuit board modules that vary in design and function but that may cause damage if inadvertently allowed to substantially insert into an incorrect card cage slot.

One embodiment of the invention is directed to an automatic test system for testing electronics, e.g., electronic devices such as semiconductor devices, circuit boards, etc. The automatic test system includes a module to be used in connection with testing the electronics, a module holder (e.g., a card cage), and a control subsystem. The control subsystem includes a first element attached to the module. The first element has one of an identifier and a sensor. The control subsystem further includes a second element attached to the module holder. The second element has the other of the identifier and the sensor. The sensor is configured to (i) read the identifier when the module begins insertion into the module holder and (ii) provide a sensor signal in response to reading the identifier. The sensor signal has a value indicative of the identifier. The control subsystem further includes a controller which couples to the sensor. The controller is configured to receive the sensor signal from the sensor and output a control signal based on the sensor signal. The control signal indicates whether the module is authorized to substantially insert into the module holder. The control signal is capable of being used in a variety of applications such as (i) activating a warning light or sounding an alarm when the module is not authorized to substantially insert along a card cage slot thus notifying a user (e.g., a technician configuring the automatic test system for a test) and/or (ii) moving an actuator to a position that either physically blocks the module from further inserting along the card cage slot when the control signal indicates that the module is not authorized to substantially insert or a position that enables the module to pass when the control signal indicates that the module is authorized to substantially insert.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the invention are directed to techniques for controlling movement of a circuit board module into a module holder (e.g., a card cage along a card cage slot) which involve sensing an identifier of the module and electronically authorizing further insertion of the module based on the identifier. As a result, control over insertion of the module does not need to take place at the back end of the module holder (e.g., in the area of a backplane). Rather, such control may take place at the front of the module holder to robustly and reliably prevent damage to the module if the module is not authorized to substantially insert into the module holder. Such techniques are well-suited for use in an automatic test system (e.g., automated test equipment) having a universal slot architecture where modules are configured to fit into any universal slot of a card cage.

Figure 1:
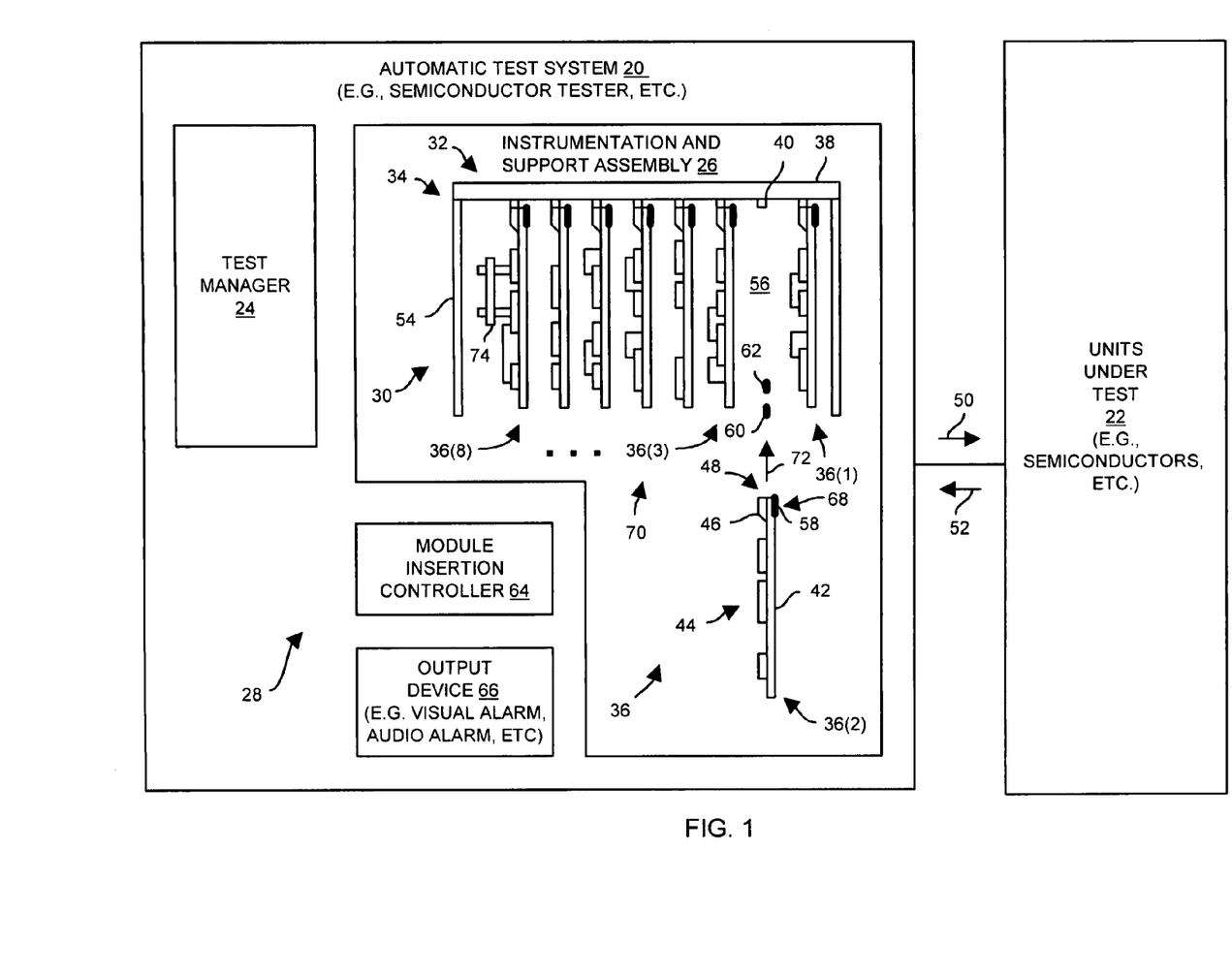
FIG. 1 is a block diagram of an automatic test system (i.e., automated test equipment) which is suitable for use by the invention.

FIG. 1 shows an automatic test system 20 (e.g., a semiconductor tester, a circuit board tester, etc.) which is suitable for use by the invention. The automatic test system 20 is configured to robustly and reliably test, in volume, units-under-test (UUTs) 22. Examples of UUTs 22 include semiconductor devices, circuit boards, and the like.

As shown in FIG. 1, the automatic test system 20 includes a test manager 24, an instrumentation assembly 26 and a module insertion control subsystem 28. The instrumentation assembly 26 includes a card cage 30, a backplane 32 mounted to a back end 34 of the card cage 30, and a set of circuit board modules 36(1), ..., 36(8) (collectively, circuit board modules 36). The backplane 32 includes a rigid member 38 which is substantially planar in shape, and columns of backplane connectors 40 supported by the rigid member 38.

Each circuit board module 36 includes a circuit board 42, electronic circuitry 44 (e.g., integrated circuit components, discreet components, etc.) mounted to the circuit board 42, and circuit board connectors 46 attached to the circuit board 42 along a leading edge 48. The circuit board modules 36 vary in design and function and operate under direction of the automatic test system 20 to apply signals 50 to and detect signals 52 from the UUTs 22, thus providing a robust electronic device testing environment. To this end, each circuit board module 36 is configured to perform a specialized operation such as driving digital signals onto the UUTs 22, detecting digital signals from the UUTs 22, driving analog signals onto the UUTs 22, detecting analog signals from the UUTs 22, providing power supply signals, providing overhead and timing, and so on. Accordingly, not all circuit board modules 36 are required during each test, and the particular combination of circuit board modules 36 which are used during any given test depends on the type of UUTs 22 (e.g., microprocessors, analog devices, RF components, etc.) and the type of electronic testing to be performed.

As further shown in FIG. 1, the card cage 30 is configured to hold various combinations of the circuit board modules 36 in place relative to the backplane 32. To this end, the card cage 30 includes multiple support members 54. Some support members 54 include rails which define universally-sized card cage slots 56, i.e., channels of uniform size which permit insertion, at least initially, of any circuit board module 36. Other support members 54 define sides of the card cage 30 which extend in a substantially parallel manner to the modules 36 housed within the card cage 30. It should be understood that FIG. 1 illustrates a top view of the card cage 30 so that only the support members 54 forming the sides of the card cage 30 are visible in FIG. 1.

The module insertion control subsystem 28 includes circuit board elements 58 which attach to the circuit board modules 36, sensors or electronic readers 60, actuators 62, a module insertion controller 64, and an output device 66. The sensors 60 and the actuators 62 are shown closely integrated with the instrumentation assembly 26 in FIG. 1 (i.e., within the box for the instrumentation assembly 26) since the sensors 60 and the actuators 62 attach to the card cage 30 along respective card cage slots 56. As will be explained in further detail shortly, the circuit board element 58 attached to each module 36 has an identifier 68 (e.g., a magnetic code, an RF tag, a barcode or matrix code pattern, a character string pattern, etc.) thus enabling the module insertion control subsystem 28 to (i) distinguish the modules 36 from each other as well as (ii) detect when a module 36 is about to insert into the card cage 30 along a particular card cage slot 56 and thus control whether that module 36 substantially inserts into the card cage 30 along that card cage slot 56. In FIG. 1, a sensor 60 and actuator 62 is shown for a card cage slot 56 that does not currently hold a circuit board module 36 while the sensors 60 and the actuators 62 for the other card cage slots 56 are hidden in FIG. 1 by the circuit board modules 36 currently residing within the card cage 30.

It should be understood that, even though the card cage slots 56 are universal in size, certain card cage slots 56 may not be configured to fully receive certain circuit board modules 36. As just mentioned, the module insertion control subsystem 28 is configured to control insertion of these modules 36. In particular, when a user attempts to insert a module 36 into a particular card cage slot 56 at a front opening 70 of the card cage 30 (e.g., see the arrow 72 in connection with the module 36(2) in FIG. 1), the sensor 60 along that slot 56 senses the identifier 68 from the circuit board element 58 on that module 36. The sensor 60 then communicates the identifier 68 to the module insertion controller 64 which determines whether that module 36 is authorized to substantially insert into the card cage slot 56. If the module 36 is authorized to substantially insert in to the slot 56, the module insertion controller 64 directs the actuator 62 along that slot 56 to permit further module insertion. However, if the module 36 is not authorized, the controller 64 directs the actuator 62 to physically block further module insertion (i.e., the actuator 62 bars entry of the module 36 beyond a certain point along the slot 56) and outputs a warning or complaint through the output device 66 such as a visual warning (e.g., a flashing red light) and/or an audio warning (e.g., a bell or buzzer sound) to warn the user that (i) the module 36 is not authorized to insert into that slot 56 and (ii) if further insertion were otherwise permitted, damage to the module 36 and/or the backplane 32 could result.

By way of example only, suppose that the circuit board module 36(1) has circuit board connectors 46 which properly align with corresponding backplane connectors 40 of the backplane 32 in the right-most card cage slot 56 thus enabling the module 36(1) to fully insert and connect with backplane 32 in the right-most slot 56, as shown in FIG. 1. However, further suppose that the circuit board connectors 46 of the module 36(1) do not properly align with the backplane connectors 40 in the adjacent card cage slot 56. Accordingly, if the module 36(1) were allowed to substantially insert into the adjacent slot 56, damage to the connectors 40, 46 and perhaps other components of the automatic test system 20 could result. To prevent such damage, the module insertion control subsystem 28 is capable of being configured to allow the module 36(1) in substantially insert into the right-most slot 56 but not the adjacent slot 56 by detecting the identifier 68 of the module 36(1) and determining whether the module 36(1) is authorized to insert into the adjacent slot 56 based on that identifier 68. Without such operation, the module 36(1) and/or the backplane 32 could sustain damage due to substantial insertion of the module 36(1) into the adjacent slot 56.

As another example, suppose that the circuit board module 36(8) includes a component 74 (e.g., a large heat sink, a power converter on an elevated secondary circuit board, etc.) which makes the module 36(8) too tall to properly fit into any of the card cage slots 56 except for the left-most card cage slot 56 of the card cage 30, as shown in FIG. 1. Again, to avoid damage to the module 36(8) and perhaps other modules 36, the module insertion control subsystem 28 operates to only permit substantial insertion of the module 36(8) into the left-most slot 56 and no other slots 56. Further details of the invention will now be provided with reference to FIG. 2.

Figure 2:
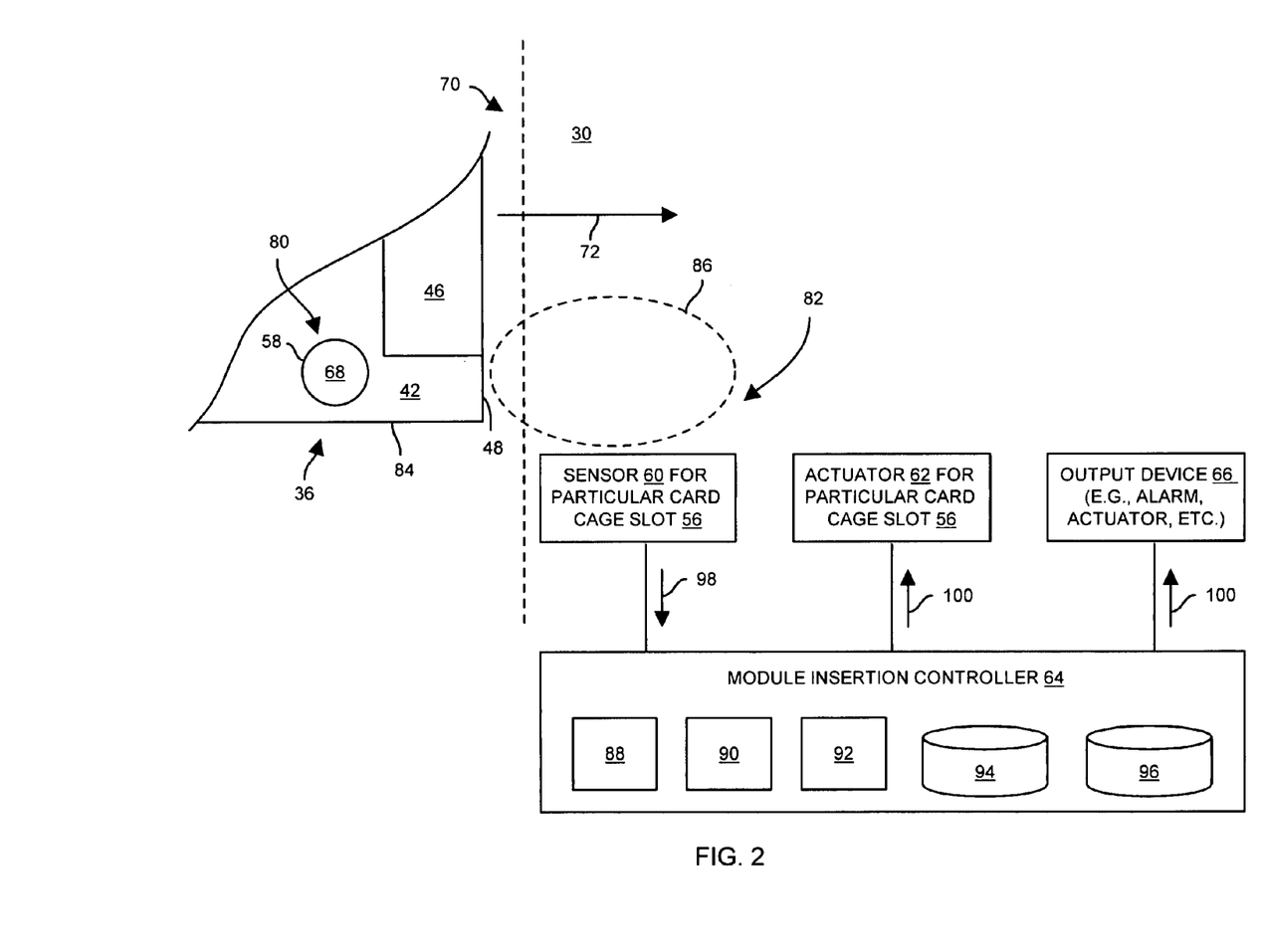
FIG. 2 is a block diagram of a control subsystem of the automatic test system of FIG. 1.

FIG. 2 is a block diagram of particular components of the module insertion control subsystem 28 which operate for a particular card cage slot 56 of the card cage 30 and a portion of a circuit board module 36 which is about to insert into that card cage slot 56. As explained earlier, the module insertion control subsystem 28 controls whether the module 36 is authorized to substantially insert into that card cage slot 56.

As shown in FIG. 2, a circuit board element 58 having an identifier 68 attaches to a common location 80 on the circuit board 42 of the circuit board module 36. Preferably, the location 80 of the circuit board element 58 is near the leading edge 48 of the module 36. Similarly, the sensor 60 and the actuator 62 are also located at a location 82 near the front opening 70 of the card cage 30 along the particular card cage slot 56. The locations 80, 82 of the components 58, 60 enable early sensing of the identifier 68 before the leading edge 48 of the module 36 has substantially inserted into the card cage 30 along a card cage slot 56. It should be understood that, in some instances, the location 80 is somewhat offset from the leading edge 48 rather than immediately on the leading edge due to high density placement of the circuit board connectors 46 along the leading edge 48 as illustrated in FIG. 2. If necessary, the sensor 60 and the actuator 62 are capable of being located anywhere within the card cage 30 except the very back 34.

As further shown in FIG. 2, the location 80 of the circuit board element 58 is preferably along a side edge 84 of the circuit board module 36 which is nearest to the sensor 60 of the card cage slot 56. Such positioning enables the sensor 60 to have a relatively small sensing field 86. With a very narrow sensing field 86, there is no likelihood of the sensor 60 inadvertently sensing the identifier 68 of a circuit board element 58 of another circuit board module 36 during insertion of that module 36 into an adjacent card cage slot 56.

It should be understood that the module insertion controller 64 couples to all sensors 60, all actuators 62 and the output device 66 even though only one sensor 60 and one actuator 62 are shown in FIG. 2 to illustrate activity for a particular card cage slot 56. As shown in FIG. 2, the module insertion controller 64 includes a power source 88, processing circuitry 90, a display monitor 92, an authorization database 94 and a configuration database 96. In one arrangement, the module insertion controller 64 resides within a computer that further operates as the test manager 24 thus enabling concurrent use of a single computer for both operations. Preferably, the power source 88 is independent of the power source that powers testing of the UUTs 22 so that the module insertion control subsystem 28 remains in operation to protect against damage to the automatic test system 20 even when there is no current testing of the UUTs 22. Further details of the operation of the module insertion control subsystem 28 will now be provided.

When the circuit board module 36 begins insertion into the card cage 30, the sensor 60 reads the identifier 68 from the circuit board element 58 of the module 36, and provides a sensor signal 98 in response to reading the identifier 68. The sensor signal 98 denotes the identifier 68 (e.g., a number represented by a pattern, a magnetic code, an RF tag, etc.). The module insertion controller 64 receives the sensor signal 98 from the sensor 60 and outputs a control signal 100 indicating whether the circuit board module 36 is authorized to substantially insert into the card cage 30 along the card cage slot 56. To this end, the processing circuitry 90 queries the authorization database 94 to determine whether the identifier 68 corresponds with the slot 56 associated with the sensor 60 (e.g., by comparing the identifier 68 to an expected identifier in the authorization database 94 associated with the slot 56). If the identifier 68 indicates that the module 36 is authorized to substantially insert into the card cage 30 along the card cage slot 56 (e.g., if there is a match with the authorization database 94), the module insertion controller 64 provides the control signal 100 with a first value (e.g., a particular voltage level, a binary number, etc.). If the identifier 68 indicates that the module 36 is not authorized to substantially insert into the card cage 30 along the card cage slot 56 (e.g., if there is not a match), the module insertion controller 64 provides the control signal 100 with a second value that is different than the first value.

If the control signal 100 has the first value (i.e., the module 36 is authorized to substantially insert into the card cage 30 along the card cage slot 56), the actuator 62 moves to a position that enables such insertion (e.g., the actuator 62 moves a tab or other type of mechanical stop out of the slot 56 thus enabling the module 36 to freely slide completely into the card cage 30 along the slot 56. However, if the control signal 100 has the second value (i.e., the module 36 is not authorized to substantially insert into the card cage 30 along the card cage slot 56), the actuator 62 moves to or remains in a position that prevents such insertion (e.g., the tab remains in a blocking orientation). Accordingly, if the module 36 does not have authorization to substantially insert into the card cage 30 along the card cage slot 56, the module insertion control subsystem 28 denies further insertion of the module along the slot 56. Since the module 36 has not substantially moved into the card cage along the slot 56, there is no possibility of causing damage by contact between the module 36 and the backplane 32. Furthermore, any tall components on the module 36 have not had an opportunity to contact a neighboring obstruction thus preventing damage to these tall components. Additionally, the processing circuitry 90 stores the result of the query operation in the configuration database 96 (e.g., a logfile). This feature provides users of the automatic test system 20 with an operation history. For example, a user is capable of easily displaying the current configuration of circuit board modules 36 in the card cage 30 (i.e., to see which modules 36 are in which slots 56) on the display monitor 92 of the controller 64 by subsequently accessing the configuration database 96. Furthermore, the user is capable of determining how frequently module insertion was denied by the module insertion control subsystem 28 for tracking purposes. Further details of the invention will now be provided with reference to FIGS. 3 and 4.

Figure 3:
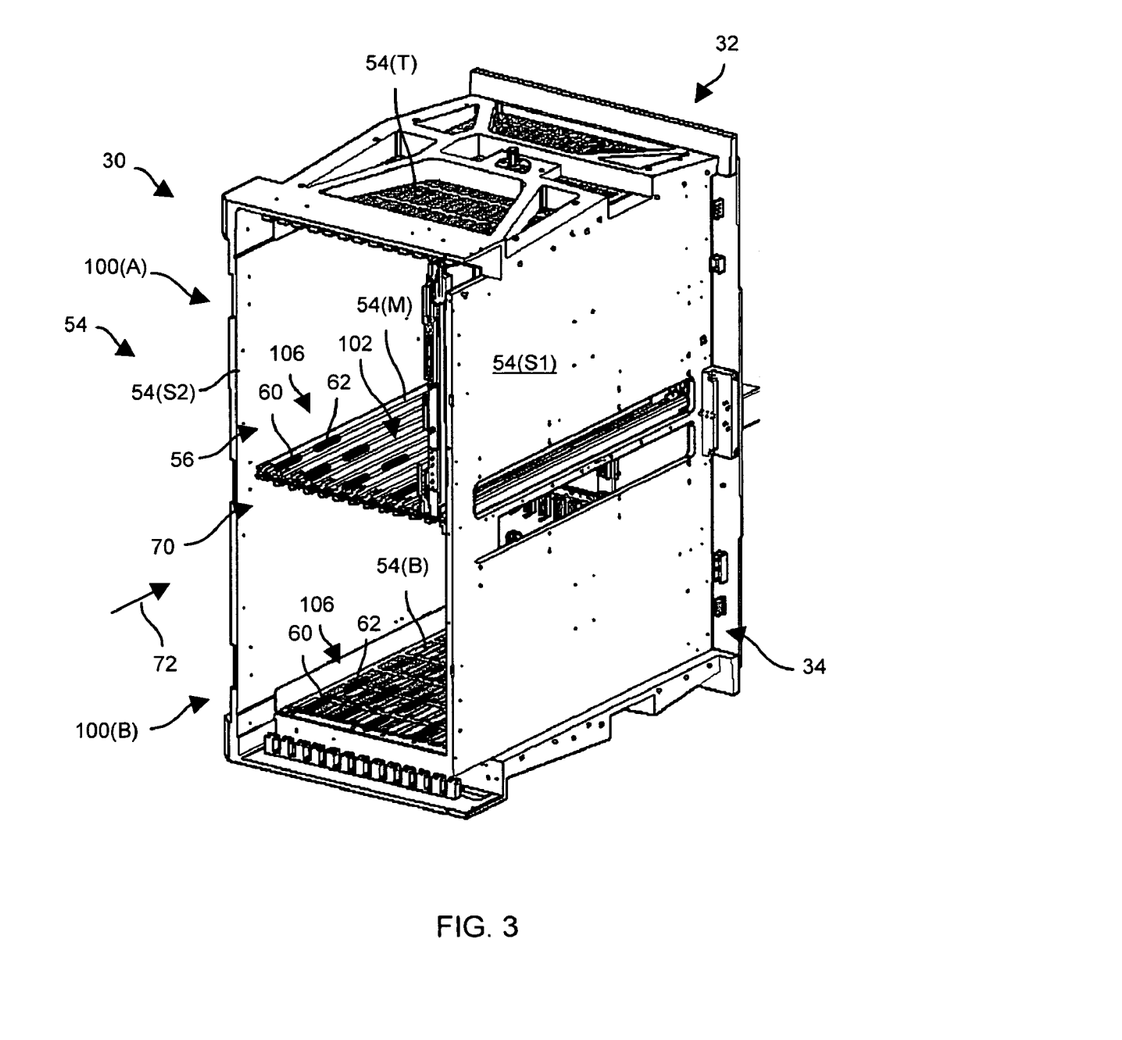
FIG. 3 is a perspective view of a card cage of the automatic test system of FIG. 1.
Figure 4:
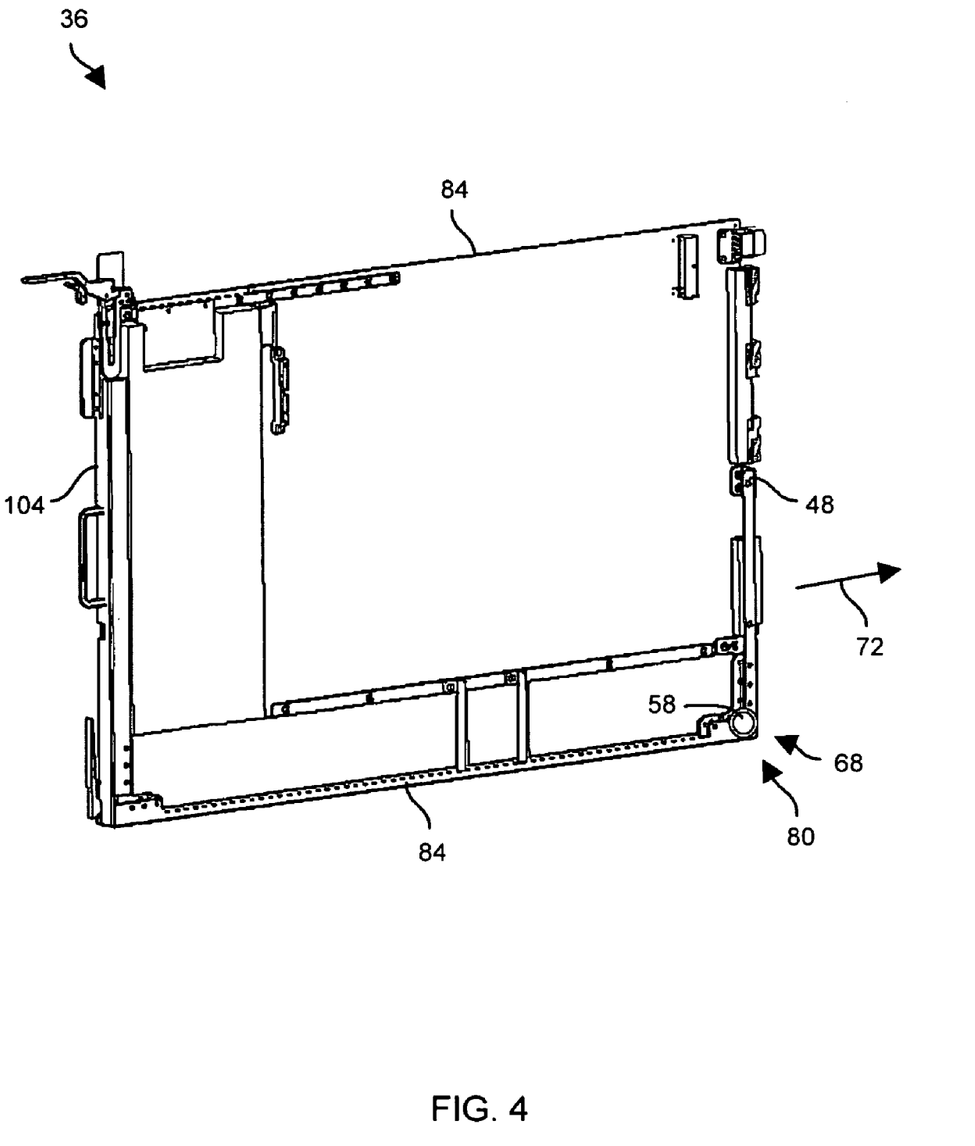
FIG. 4 is a perspective view of a circuit board module of the automatic test system of FIG. 1.

FIG. 3 shows a perspective view of the card cage 30 and the backplane 32, and FIG. 4 shows a perspective view of a circuit board module 36 which is authorized to substantially insert into at least one but not all of the card cage slots 56 of the card cage 30. By way of example only, the card cage 30 includes multiple levels 100(A), 100(B) which are defined by support members 54(S1), 54(S2), 54(T), 54(M), 54(B) (collectively, support members 54). As shown in FIG. 3, the card cage slots 56 are universally-sized, i.e., rails or card guides 102 along the support members 54(T), 54(M), 54(B) define channels of the same size. By way of example only, the card cage 30 is oriented such that the card cage slots 56 are substantially vertical.

To insert a module 36 within a card cage slot 56, a user positions side edges 84 of the circuit board module 36 (FIG. 4) into the rails 102 (FIG. 4) with the leading edge 48 first, and pushes against the trailing edge 104 to move the module 36 forward in the direction 72 (also see FIG. 1). Such movement enables convenient reading of the identifier 68 by the sensor 60 of that card cage slot 56. By way of example only, both the sensors 60 and the actuators 62 are located along common bottom locations 106 of their corresponding card cage slots 56 (see FIG. 3) and the circuit board elements 58 on the circuit board modules 36 are located along a bottom side edge 84 at a common location 80 of the circuit board modules 36 (see FIGS. 4 and 2). In other arrangements, the components 58, 60, 62 of the module insertion control subsystem 28 are commonly located at the top of the card cage 30 and the top side edge 84 of the module 36. Furthermore, in some arrangements, the sensors 60 are commonly located along one support member 54 (e.g., the bottom support member 54) and the actuators 62 are commonly located on an opposite support member 54 (e.g., the top support member 54) to enable placement of the actuators 62 nearer the front opening 70 of the card cage 30 along their respective slots 56.

It should be understood that the sensors 60, actuators 62 and circuit board elements 58 operate to distinguish modules 36 based on design and function so that users do not inadvertently damage a module 36 of the automatic test system 20 by substantially inserting the module 36 into an unauthorized card cage slot 56. In some arrangements, the sensors 60 reside in inactive states at times and movement of the module 36 at the front opening 70 along the card cage slot 56 triggers sensor operation 60.

It should be further understood that the number of available identifiers 68 for the circuit board elements 58 is extremely high. In one arrangement, the sensors 60 include pattern readers and the circuit board elements 58 define, as the identifiers 68, patterns (e.g., tape with barcodes or matrix codes, strings of characters, etc.) thus providing essentially a limitless number of identifiers 68. In another arrangement, the sensors 60 include magnetic heads and the circuit board elements 58 include magnetic strips which store, as the identifiers 68, magnetically readable data. In yet another arrangement, the sensors 60 include RF receivers and the circuit board elements 58 include RF transmitters which output, as the identifiers 68, RF tags or signatures (e.g., similar to an employee badge scanning system). Other similar types of identification mechanisms are suitable for use by the invention as well. Further details of the invention will now be provided with reference to FIG. 5.

Figure 5:
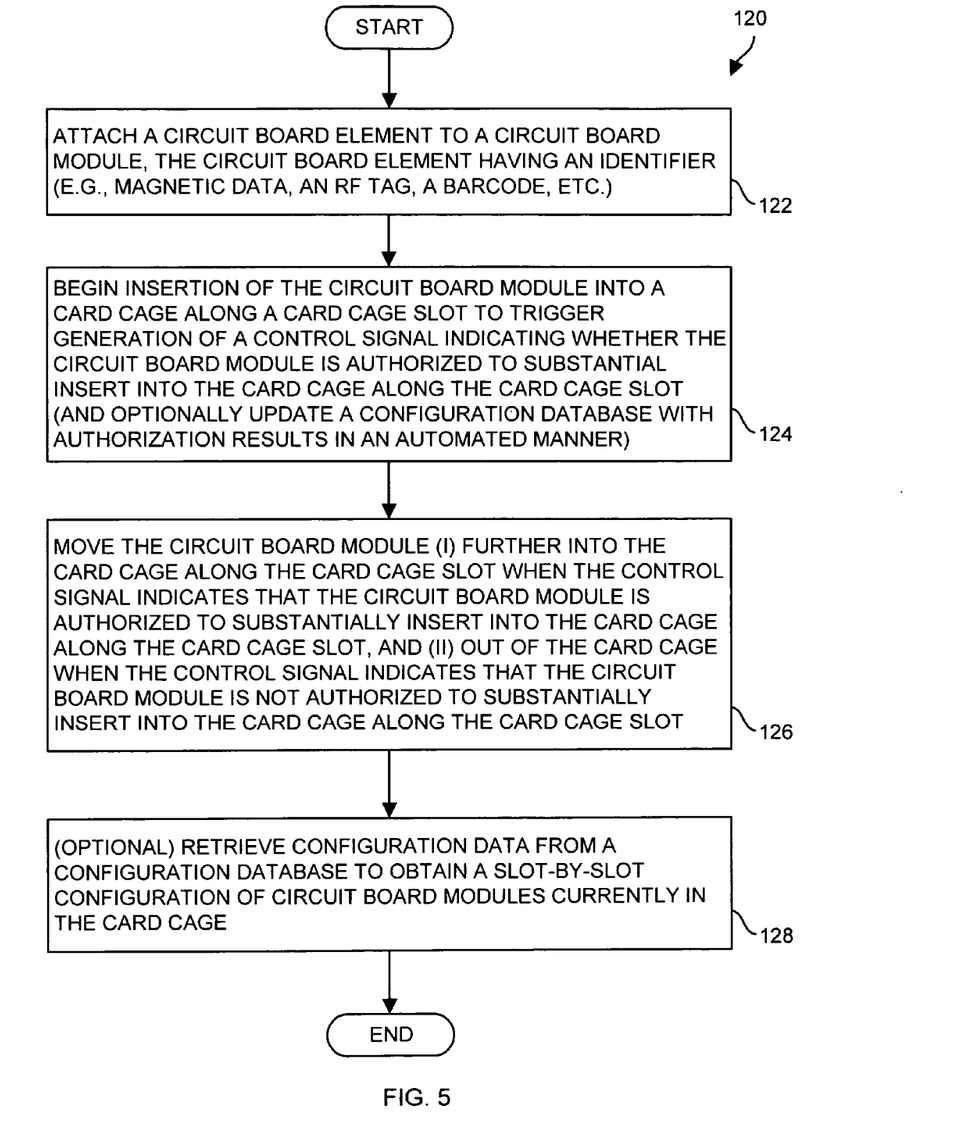
FIG. 5 is a flowchart of a procedure which is performed by a user of the automatic test system of FIG. 1.

FIG. 5 is a flowchart of a procedure 120 which is performed by a user of the automatic test system 20 to control insertion of a circuit board module 36 into the card cage 30 along a card cage slot 56. Prior to beginning the procedure 120, it is assumed that the user has correctly configured the authorization database 94 of the module insertion control subsystem 28 so that a particular identifier 68 of a circuit board element 58 is correctly authorized for a particular card cage slot 56.

In step 122, the user (e.g., the manufacturer, the customer, etc.) attaches the circuit board element 58 having the identifier 58 to the circuit board module 36. For example, if the circuit board element 58 is a sticker having, as the identifier 68, a pattern (e.g., a barcode), the user affixes the sticker to the surface of the circuit board 42 at a location where the sticker will be easily read by the sensors 60 (also see FIG. 1). In the context of an RF tag or a magnetically readable strip, the user simply fastens that device to the circuit board module 36 in a reliable manner. If the user has not correctly configured the authorization database 94 so that the particular identifier 68 of the circuit board element 58 is correctly authorized to allow substantial insertion of the module 56 into the intended slot 56, the user performs such configuration at this time.

In step 124, the user begins insertion of the module 36 into the card cage 30 along the slot 56. This activity triggers generation of the sensor signal 98 from the sensor 60 fastened to that slot 56 and thus generation of the control signal 100 from the module insertion controller 64 (also see FIG. 2). The control signal 100 indicates whether the module 36 is authorized to substantially insert into the card cage 30 along the slot 56 based on a comparison of the identifier 58 with the authorization database 94.

In step 126, the user moves the module 36 further into the card cage 30 along the slot 56 when the control signal 100 indicates that the module 36 is authorized to substantially insert into the card cage 30 along the slot 56 (i.e., the user manually slides or pushes the module 36 into the slot 56 until the circuit board connectors 46 of the module 36 connect with the backplane connectors 40 of the backplane 32). However, the user moves the module 36 out of the card cage 30 when the control signal 100 indicates that the module 36 is not authorized to substantially insert into the card cage 30 along the slot 56. In particular, if the module 36 is authorized for insertion into that slot 56, the control signal 100 positions the actuator 60 at that slot 56 to move in a manner that permits substantial insertion of the module 36 in the card cage 30 along the slot 56. However, if the module 36 is not authorized, the control signal 100 directs the output device 66 to warn the user not to move the module 36 further into the card cage 30 along the slot 56 thus avoiding the possibility of damaging the automatic test system 20 (i.e., the user manually removes the module 36 from the card cage 30 in response to a visual and/or audio warning). At this time, the controller 64 automatically stores this activity as configuration data in the configuration database 96 (e.g., in a logfile).

In step 128, the user optionally accesses the configuration database 96 to retrieve the configuration data from the configuration database 96. In particular, the user conveniently displays the current configuration of modules 36 in the card cage 30 on a slot 56 by slot 56 basis so that the user know exactly which modules 36 are in place for testing.

As mentioned above, embodiments of the invention are directed to techniques for controlling movement of a circuit board module 36 into a card cage 30 along a card cage slot 56 which involve sensing an identifier 68 of the module 36 and electronically authorizing further insertion of the module 36 based on the identifier 68. As a result, control over insertion of the module 36 does not need to take place at the back end 34 of the card cage 30 (e.g., in the area of a backplane 32). Rather, such control may take place at the front opening 70 of the card cage 30 to robustly and reliably prevent damage to the module 36 if the module 36 is not authorized to substantially insert along the card cage slot 56 of the card cage 30. Such techniques are well-suited for use in a automatic test system 20 (e.g., automated test equipment) having (i) a card cage 30 that provides universally-sized card cage slots 56 and (ii) a variety of modules 36 that vary in design and function but that may cause damage if inadvertently allowed to substantially insert into an incorrect card cage slot 56.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the number of modules 36 and slots 56 shown in FIGS. 1 and 3 were by way of example only, and that the various embodiments of the invention are well-suited for protecting automatic test systems 20 having any number of slots 56 against damage.

Additionally, it should be understood that module insertion control subsystem 28 was described above in the context of an automatic test system 20 by way of example only. The module insertion control subsystem 28 is capable of operating as a control system for controlling movement of a circuit board module along a card cage slot of a card cage in a variety of other environments as well (e.g., non-tester environments) such as card cages configured to hold circuit boards for testing those circuit boards, general purpose computers, specialized systems, and the like.

Furthermore, it should be understood that the control signal 100 was described above as being utilized for controlling an actuator 62 that blocks further insertion of a circuit board module 36 and for activating an output device 66 to provide a warning to a user by way of example only. In some arrangements, the control signal 100 controls only an output device 66 to provide warnings but does not any control actuators thus providing a simple and low cost mechanism for warning users not to further insertion modules 36. In other arrangements, the control signal 100 controls only actuators 62 and does not provide warnings.

Moreover, it should be understood that there are other uses for the control signals 100 such as for electrically disabling signal passage to the modules 36. In such a situation, the connectors 46, 40 may be able to physically mate properly without sustaining mechanical damage, but there may be signal use incompatibilities between the connectors 46, 40. Such incompatibilities can be avoided using the control signals 100 by allowing the control signals 100 to selectively allow and disallow signal passage through connectors (e.g., using relays, using transistors, etc.).

Additionally, it should be understood that the card cage 30 was described above as having two levels 100(A), 100(B) and that the sensors 60 and actuators 62 had bottom locations 106 consistently on both levels 100(A), 100(B) by way of example only (also see FIG. 3). Other arrangements the locations of the sensors 60 and actuators 62 are different between levels 100(A), 100(B). In one arrangement, the sensors 60 and 62 having bottom locations in level 100(B) as shown in FIG. 3, but have top locations on the on the support member 54(T) for level 100(A). Furthermore, in this arrangement, the circuit board modules 36 insert into the slots 56 of level 100(B) in the orientation shown in FIG. 4, but insert upside down (i.e., rotated 180 degrees) when inserting into the level 100(A). This arrangement alleviates congestion of sensors 60 and actuators in the common support member 54(M) which provides rails 102 in both directions.

Furthermore, it should be understood that the tester 20 which was described above as providing (i) both the sensor 60 and the actuator 62 in the card cage 30 and (ii) the elements 58 having the identifiers 68 on the modules 36 by way of example only. Other configurations are suitable as well. For example, in some arrangements, the tester 20 is configured such that (i) the identifiers 68 reside in elements 58 at the card cage slots 56 and (ii) the sensors 60 reside on the modules 36. In these arrangements, contacts from the modules 36 (e.g., pads or traces of the circuit boards 42) electrically communicate with corresponding contacts along the rails/card guides 102 which define the card cage slots 56 to provide power (at least temporarily) to the modules 36. This powering of the modules 36 enables the sensors 60 on the modules 36 to (i) sense the identifiers 68 of the slots 56 as the modules begin engagement with the respective slots 56 of the card cage 30 and (ii) send the sensor signal 98 to the module insertion controller 64 (e.g., through a wireless transmission, through electrical contact between the contacts of the modules 36 and the card guides 102, etc.). These arrangements alleviate the need for separate sensors/readers 60 on the card cage 30, and enables (i) simple placement of the elements 58 having the identifiers 68 and contacts (e.g., electrodes that wipe against other electrodes of the modules 36) at the card cage slots 56 and (ii) convenient placement of the sensors 60 on the modules 36. Such modifications and enhancements are intended to belong to various embodiments of the invention.

What is claimed is:

1. A control system for indicating whether a module should be inserted into a module holder, the control system comprising:
    a sensor which is configured to attach to one of a module and the module holder, the sensor being further configured to (i) read an identifier of an element attached to the other of the module and the module holder when the module begins insertion into the module holder and (ii) provide a sensor signal in response to reading the identifier, the sensor signal denoting the identifier; and
    a controller which couples to the sensor, the controller being configured to receive the sensor signal from the sensor and output a control signal based on the sensor signal, the control signal indicating whether the module is authorized to substantially insert into the module holder.

2. The control system of claim 1 wherein the module holder includes a card cage having a first support member defining a first set of rails and a second support member defining a second set of rails; wherein the first and second sets of rails form a universal card cage slot which is sized to receive differently designed modules configured to perform different functions; and wherein the sensor is configured to fasten to one of the first and second support members at a location which is adjacent the universal card cage slot and proximate to a front opening of the card cage.

3. The control system of claim 2, further comprising:
    a circuit board having a leading edge, a back edge opposite the leading edge, and side edges; and
    circuit board connectors disposed along the leading edge of the circuit board, wherein the circuit board connectors are configured to connect with backplane connectors when the side edges of the circuit board engage with the first and second sets of rails forming the universal card cage slot and when the module substantially inserts into the card cage along the universal card cage slot, and wherein the element fastens to a location on the circuit board adjacent both the front edge and one of the side edges.

4. The control system of claim 1 wherein the sensor is configured to provide the sensor signal with a value indicative of the identifier of the element in response to movement of the element in a vicinity of the sensor.

5. The control system of claim 4 wherein the element defines, as the identifier, a pattern; and wherein the sensor includes a pattern reader which is configured to read the pattern defined by the element.

6. The control system of claim 4 wherein the element includes a radio frequency tag which is configured to provide, as the identifier, a radio frequency signature; and wherein the sensor includes a receiver which is configured to receive the radio frequency signature from the radio frequency tag.

7. The control system of claim 4 wherein the element includes a magnetic strip which magnetically stores the identifier, and wherein the sensor includes a head which is configured to read the identifier from the magnetic strip.

8. The control system of claim 1 wherein the module holder includes a card cage, and wherein the control system further comprises:
    an output device coupled to the controller, the output device being configured to receive the control signal from the controller and output a warning when the control signal indicates that the module is not authorized to substantially insert into the card cage along a card cage slot.

9. The control system of claim 1 wherein the module holder includes a card cage, and wherein the control system further comprises:
    an actuator coupled to the controller and disposed adjacent an opening of the card cage, the actuator being configured to (i) receive the control signal from the controller and (ii) move to one of:
        a first position to allow substantial insertion of the module into the card cage along a card cage slot when the control signal indicates that the module is authorized to substantially insert into the card cage along the card cage slot, and
        a second position to inhibit substantial insertion of the module into the card cage along the card cage slot when the control signal indicates that the module is not authorized to substantially insert into the card cage along the card cage slot.

10. The control system of claim 1 wherein the controller includes:
    an authorization database of entries; and
    compare circuitry configured to determine whether the module is authorized to substantially insert into the module holder based on a comparison of the identifier with the entries of the authorization database.

11. The control system of claim 1 wherein the controller includes:
   a configuration database; and
   display circuitry configured to store configuration data and retrieve configuration data from the configuration database, the configuration data indicating whether module currently is substantially inserted into the module holder.

12. The control system of claim 6, further comprising:
   a control system power source coupled to the sensor and the controller, the control system power source being configured to provide power to the sensor and the controller regardless of whether the module receives power through the module holder.

* * * * *

UNITED STATES PATENT AND TRADEMARK OFFICE
CERTIFICATE OF CORRECTION

PATENT NO. : 6,975,130 B2  Page 1 of 1
DATED : December 13, 2005
INVENTOR(S) : Yan Yevmenenko It is certified that error appears in the above-identified patent and that said Letters Patent is hereby corrected as shown below:

<u>Column 14,</u>
Line 1, "system of claim 6" should read -- system of claim 1 --.

Signed and Sealed this

Eleventh Day of April, 2006

JON W. DUDAS
*Director of the United States Patent and Trademark Office*